(12) United States Patent
Yun et al.

(10) Patent No.: US 11,886,376 B2
(45) Date of Patent: Jan. 30, 2024

(54) APPARATUS INCLUDING RECONFIGURABLE INTERFACE AND METHODS OF MANUFACTURING THE SAME

(71) Applicant: Micron Technology, Inc., Boise, ID (US)

(72) Inventors: Won Joo Yun, Boise, ID (US); Sang-Hoon Shin, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 146 days.

(21) Appl. No.: 17/398,863

(22) Filed: Aug. 10, 2021

(65) Prior Publication Data

US 2023/0051183 A1 Feb. 16, 2023

(51) Int. Cl.
| | | |
|---|---|---|
| G06F 15/78 | (2006.01) | |
| G11C 7/10 | (2006.01) | |
| G11C 5/02 | (2006.01) | |
| G11C 5/14 | (2006.01) | |
| G11C 29/02 | (2006.01) | |

(52) U.S. Cl.
CPC ...... *G06F 15/7871* (2013.01); *G06F 15/7892* (2013.01); *G11C 7/1057* (2013.01); *G11C 7/1084* (2013.01)

(58) Field of Classification Search
CPC . G06F 15/7871; G06F 15/7892; G11C 5/147; G11C 7/1084; G11C 7/1057; G11C 7/1069; G11C 7/1096; G11C 5/025; G11C 29/022
USPC .......................................................... 710/52
See application file for complete search history.

(56) References Cited

U.S. PATENT DOCUMENTS

| | | | |
|---|---|---|---|
| 10,896,738 B1 | 1/2021 | Dono et al. | |
| 2010/0271092 A1* | 10/2010 | Zerbe | G11C 7/1093 327/161 |
| 2014/0266298 A1* | 9/2014 | Chen | H03K 19/0005 326/30 |
| 2015/0131388 A1* | 5/2015 | Ware | G06F 12/06 365/189.05 |
| 2021/0026796 A1* | 1/2021 | Graif | G06F 13/4282 |

* cited by examiner

*Primary Examiner* — Chun Kuan Lee
(74) *Attorney, Agent, or Firm* — Perkins Coie LLP

(57) ABSTRACT

An apparatus including reconfigurable interface circuits and associated systems and methods are disclosed herein. An reconfigurable interface circuit may include an output buffer and an input buffer coupled to a connector for respectively generating and receiving signals. The reconfigurable interface circuit may include a control circuit configured to control operation of the input and output buffers along with additional circuits to selectively implement one or more from a set of selectable communication settings.

21 Claims, 11 Drawing Sheets

APPARATUS INCLUDING RECONFIGURABLE INTERFACE AND METHODS OF MANUFACTURING THE SAME

TECHNICAL FIELD

The present technology is directed to apparatuses, such as semiconductor devices including memory and processors, and several embodiments are directed to semiconductor devices that include reconfigurable interface.

BACKGROUND

An apparatus (e.g., a processor, a memory device, a memory system, or a combination thereof) can include one or more semiconductor circuits configured to store and/or process information. For example, the apparatus can include a memory device, such as a volatile memory device, a non-volatile memory device, or a combination device. Memory devices, such as dynamic random-access memory (DRAM) and/or high bandwidth memory (HBM), can utilize electrical energy to store and access data.

With technological advancements in other areas and increasing applications, the market is continuously looking for faster, more efficient, and smaller devices. In addition, the fabricated devices are used to support growing number of new devices and new implementation modes. To meet the market demand, the semiconductor devices are being pushed to the limit with various improvements. Improving devices, generally, may include increasing circuit density, increasing operating speeds or otherwise reducing operational latency, increasing reliability, increasing data retention, reducing power consumption, or reducing manufacturing costs, among other metrics. However, such improvements can often introduce challenges in subsequent data processing, such as due to the different requirements associated with the applicable implementation modes.

DETAILED DESCRIPTION

As described in greater detail below, the technology disclosed herein relates to an apparatus, such as for memory systems, systems with memory devices, related methods, etc., for providing reconfigurable interface circuits. The apparatus (e.g., a memory device, such as an HBM, and/or system including the HBM) can include a reconfigurable interface circuit, such as for communicating test signals. The reconfigurable interface circuit may include an input buffer and/or an output buffer connected to one or more external connectors (e.g., bumps, pins, pads, etc.) for facilitating communication between one or more external devices and an internal functional circuitry. The reconfigurable interface circuit can be configured to selectively support a plurality of communication settings. For example, the reconfigurable interface circuit can be configured to operate as a single-ended path, an input/receiving only path, a supply (VDD) terminated path, and/or a multi-drop path. Also, the reconfigurable interface circuit can be configured to operate as a single-ended path, an input/receiving only path, a non-terminated path, and/or a point-to-point path. Additionally, the reconfigurable interface circuit can be configured to operate as a single-ended path, an input/output combined path, a VDD-terminated path, and/or a multi-drop path. In some embodiments, the reconfigurable interface circuit can be configured to selectively connect two paths and operate the connected paths for accommodating differential signals, such as for an input only path, VDD-terminated path, and/or a multi-drop path.

Conventional devices require pre-determined vendor specifications and communication schemes. For example, input buffer types, output buffer types, reference voltage levels, termination configurations, etc. are often required to be set before the silicon design. Thus, conventional devices are typically designed specifically for the requirements and are often inflexible in adapting to other implementation modes.

In contrast, the reconfigurable interface circuit, especially in providing a test interface, provides different parties the capacity to design/utilize suitable configurations after device manufacturing without modifications to the circuit (e.g., silicon level modifications). For example, the reconfigurable interface circuit can selectively facilitate multi-drop or point-to-point connections, single-ended or differential signals, various termination settings, input and/or output communications, or a combination thereof. Thus, the reconfigurable interface circuit provides increased flexibility to operate across different environments, different circuit configurations, different performance criteria, user-specific communication schemes, etc.

Example Environment

Figure 1B:
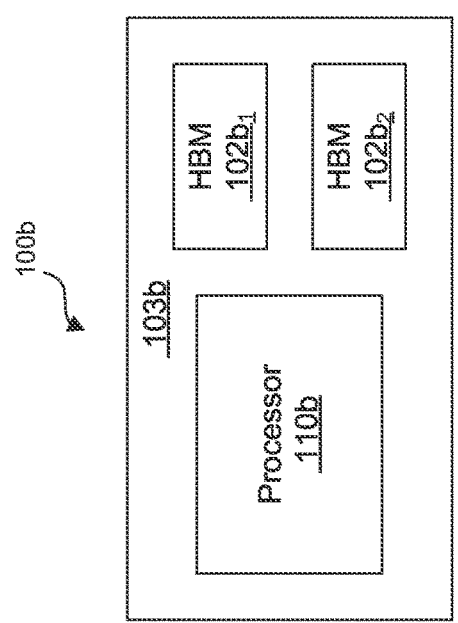
FIGS. 1A-1E are illustrations of example operating environments for an apparatus in accordance with embodiments of the technology.
Figure 1D:
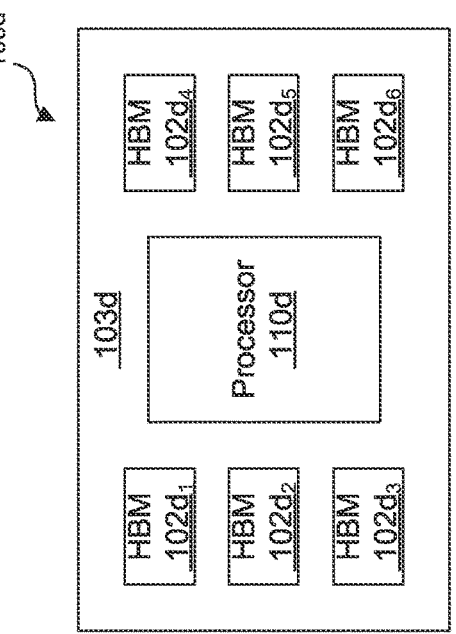
Figure 1A:
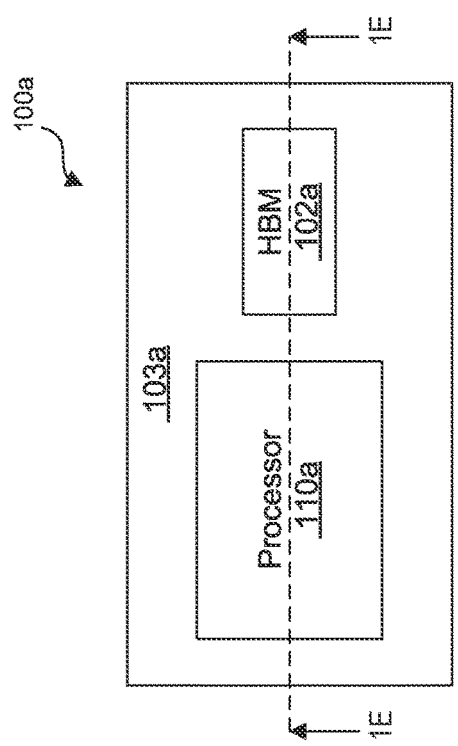
Figure 1C:
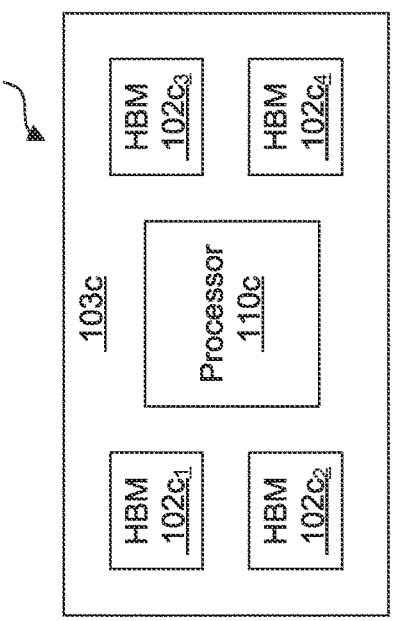

FIGS. 1A-1E are illustrations of example operating environments for an apparatus in accordance with embodiments of the technology. The operating environments can include systems that include the apparatus. In some embodiments, the apparatus can be included in a system-in-package (SiP) device that includes a processor 110 (e.g., a central processing unit (CPU), a graphics processing unit (GPU), or the like) and one or more memory devices 102 (e.g., HBMs) mounted on a support structure 103 (e.g., a package substrate, an interposer, or the like). For example, FIG. 1A illustrates a first SiP device 100a that includes one memory device 102a and one processor 110a mounted on a structure 103a. FIG. 1B illustrates a second SiP device 100b that includes two memory devices $102b_1$ and $102b_2$ and one processor 110b mounted on a structure 103b. FIG. 1C illustrates a third SiP device 100c that includes four memory devices $102c_1$-$102c_4$ and one processor 110c mounted on a structure 103c. FIG. 1D illustrates a fourth SiP device 100d that includes six memory devices $102d_1$-$102d_6$ and one processor $110d$ mounted on a structure $103d$.

For illustrative purposes, the apparatus is described as being implementable across the SiP devices $100a$-$100b$. However, it is understood that the apparatus can be implemented in other environments, such as for other systems or devices that include a different number or arrangement of memory devices and/or processors or for other circuits that correspond to variable potential interfacing options between communicating devices.

Figure 1E:
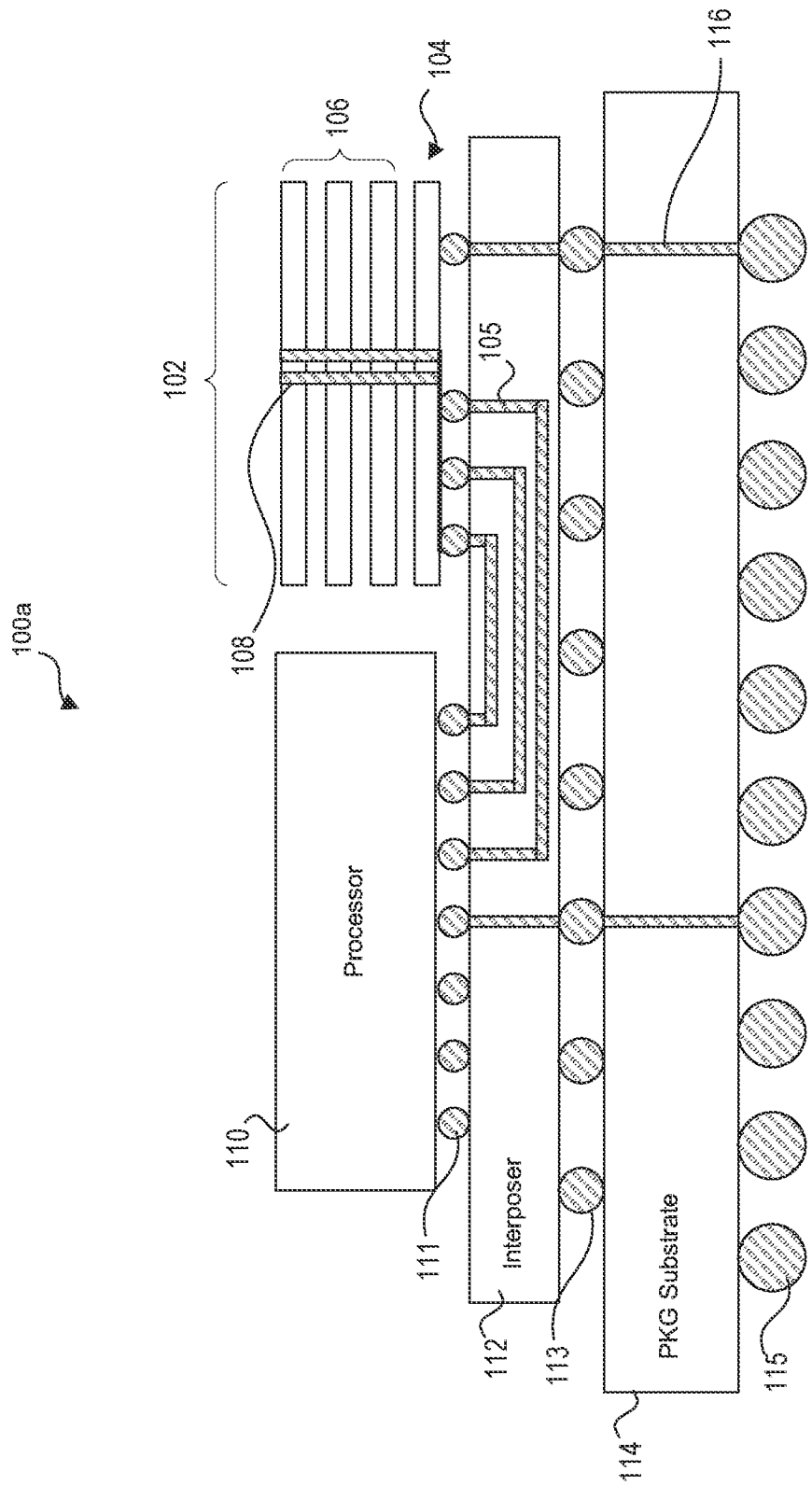

Using the SiP device $100a$ as an illustrative example, FIG. 1E illustrates a schematic cross-sectional view of the SiP device $100a$ taken along a line 1E-1E of FIG. 1A in accordance with embodiments of the technology. The SiP device 100 can include the memory device 102 and the processor 110, which are packaged together on a package substrate 114 along with an interposer 112 (e.g., the support structure $103a$ of FIG. 1A). The processor 110 may act as a host device of the SiP device $100a$.

In some embodiments, the memory device 102 may be an HBM device that includes an interface die (or logic die) 104 and one or more memory core dies 106 stacked on the interface die 104. The memory device 102 can include one or more through silicon vias (TSVs) 108, which may be used to couple the interface die 104 and the core dies 106.

The interposer 112 can provide electrical connections between the processor 110, the memory device 102, and/or the package substrate 114. For example, the processor 110 and the memory device 102 may both be coupled to the interposer 112 by a number of internal connectors (e.g., micro-bumps 111). The interposer 112 may include channels 105 (e.g., an interfacing or a connecting circuit) that electrically couple the processor 110 and the memory device 102 through the corresponding micro-bumps 111. Although only three channels 105 are shown in FIG. 1E, greater or fewer numbers of channels 105 may be used. The interposer 112 may be coupled to the package substrate by one or more additional connections (e.g., intermediate bumps 113, such as C4 bumps).

The package substrate 114 can provide an external interface for the SiP device $100a$. The package substrate 114 can include external bumps 115, some of which may be coupled (using, e.g., Through-Silicon Vias (TSVs)) to the processor 110, the memory device 102, or both. The package substrate may further include direct access (DA) bumps coupled through the package substrate 114 and interposer 112 to the interface die 104.

In some embodiments, the direct access bumps 116 (e.g., one or more of the bumps 115) may be organized into a probe pad (e.g., a set of test connectors). An external device, such as a tester, may be coupled onto the probe pad in order to directly communicate with the memory device 102. In other words, the external device may send signals to and/or receive signals from the memory device 102 without the signals passing through the processor 110. The tester may be used to pre-load one or more test patterns into a look up table of the interface die 104. The tester may then provide one or more test instructions along the direct access terminals 116. The interface die 104 may perform one or more tests on the core die 106 based on the test instructions and the pre-loaded test patterns and may generate result information. After performing the tests, the tester may read the result information out through the DA terminals 116.

The test patterns and the instructions can correspond to one or more tests performed on the memory device 102 after it has been packaged into the SiP device. The test may involve loading a pattern of data into one or more memory cells of the memory device 102 as part of a write operation, retrieving the stored information from the memory cells as part of a read operation, and comparing the written data to the read data. A test may be performed using a built-in self-test (BIST) circuit of the memory device 102. The tests may be performed using extremely long test patterns with random characteristics, which may require more storage space than is practical in the BIST circuit. Such tests may be performed by directly sending test patterns and instructions through the DA terminals 116.

Figure 2A:
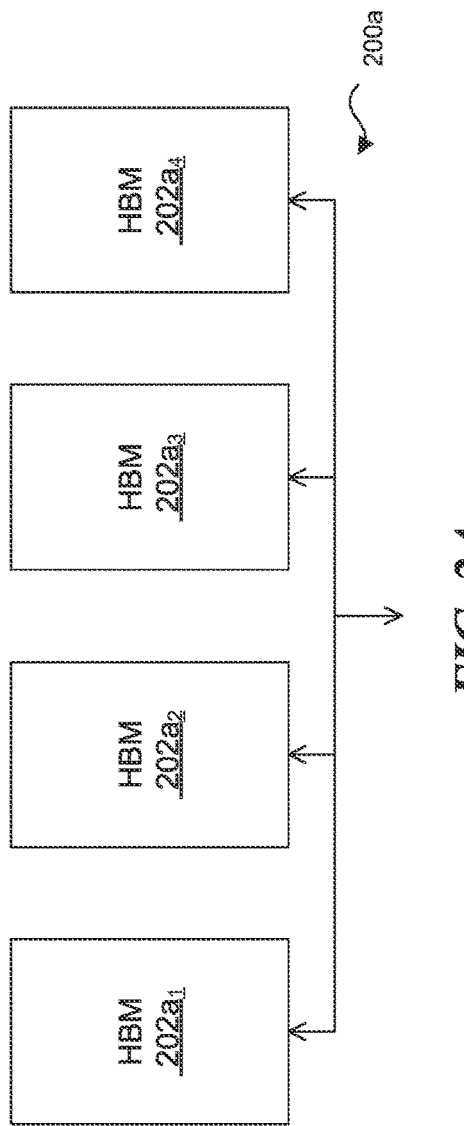
FIGS. 2A and 2B are block diagrams of example connections in accordance with embodiments of the technology.
Figure 2B:
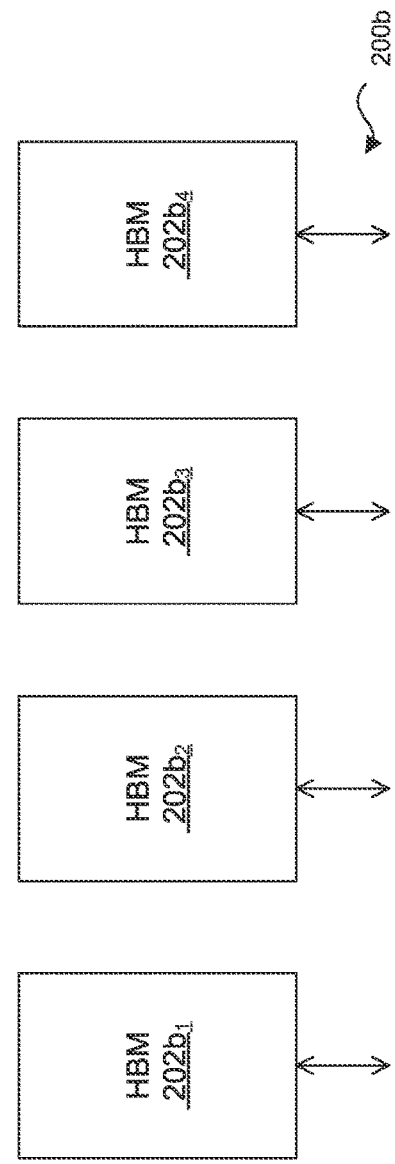

Another potential variation in the operating environment can include variations in connection configurations. As described in detail below, the apparatus can be configured to selectively accommodate multiple connection configurations. FIGS. 2A and 2B are block diagrams of example connections in accordance with embodiments of the technology.

FIG. 2A illustrates a multi-drop (connection) configuration $200a$ for a set of memory devices $202a_1$-$202a_4$ (HBMs). In some embodiments, the multi-drop configuration $200a$ can include a common bus connecting the set of memory devices $202a_1$-$202a_4$. In other embodiments, the multi-drop configuration $200a$ can include a daisy-chain connection between the set of memory devices $202a_1$-$202a_4$.

FIG. 2B illustrates a point-to-point (connection) configuration $200b$ for a set of memory devices $202b_1$-$202b_4$ (HBMs). For the point-to-point configuration $200b$, each memory device can have a direct connection to a corresponding circuit (e.g., the processor 110 of FIG. 1E or an external device, such as the tester).

Figure 3:
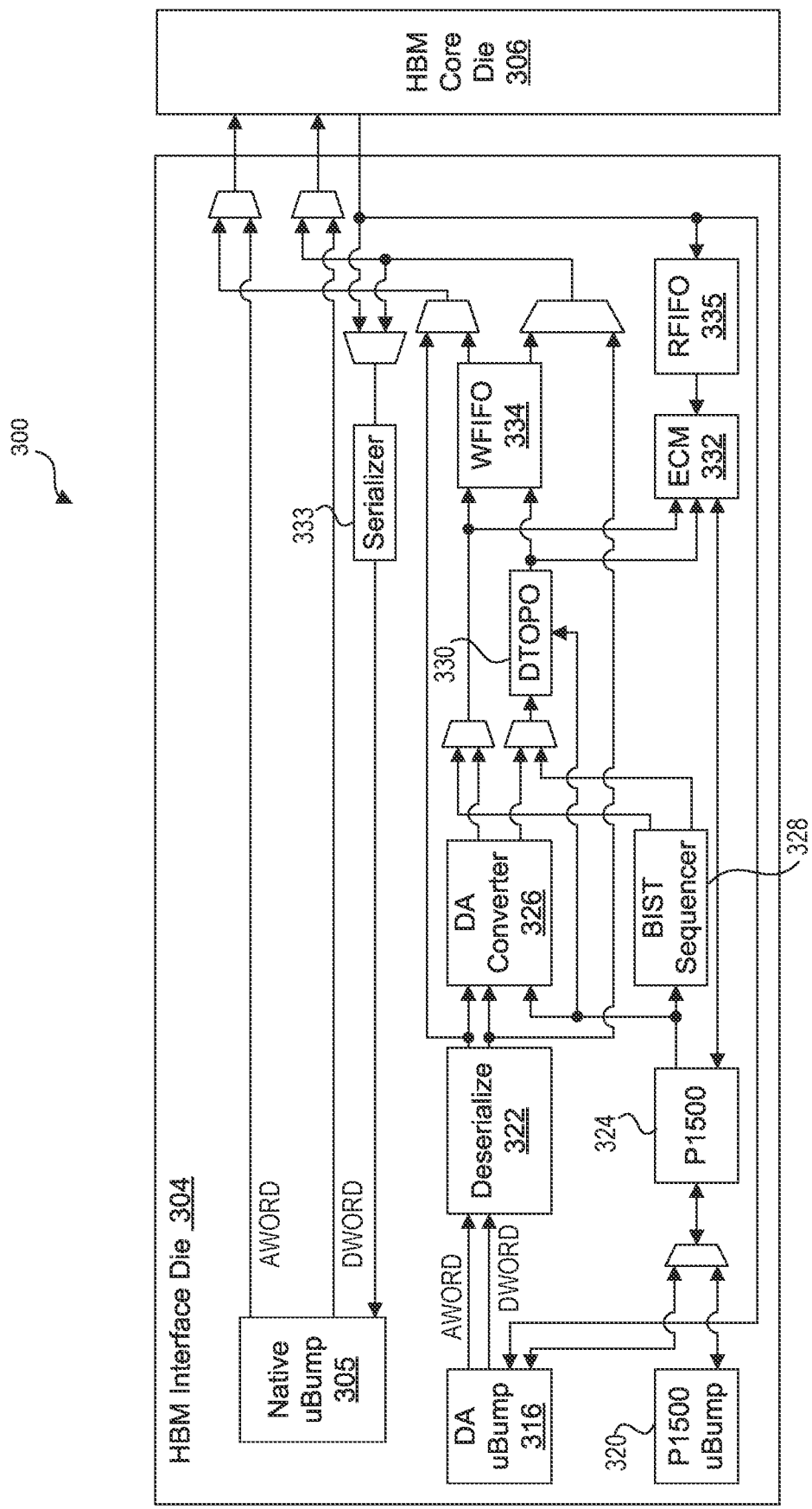
FIG. 3 is a block diagram of a memory device in accordance with embodiments of the technology.

FIG. 3 is a block diagram of a memory device 300 (e.g., the memory device 102 of FIG. 1E or a portion thereof) in accordance with embodiments of the technology. The memory device 300 may include an interface die 304 and one or more core dies 306. For clarity, only a single core die 306 is shown in FIG. 3, however it should be understood that multiple core dies 306 may be coupled to the interface die 304 (e.g., there may be 3, 7, or other quantities of core dies 306).

The memory device 300 can include different interface terminals for accessing the core die(s) 306 and/or one or more circuits of the memory. In some embodiments, the different interface terminals can include native micro-bumps (uBumps) 305, DA uBumps 316, and/or test interface uBumps 320. The test interface uBumps 320 may be part of a specific interface protocol, such as the IEEE 1500 interface (also referred to as a P1500 interface). The native uBumps 305 may, in some embodiments, be included in the uBumps 111 of FIG. 1E. The native uBumps 305 may be coupled to a processor (e.g., the processor 110 of FIG. 1E) via one or more connections (e.g., the channels 105 of FIG. 1E). The native uBumps 305 and the connections can enable the processor to access information (via, e.g., read or write operations and the corresponding exchange of information) in the core die(s) 306. For example, the core dies 306 may receive a command (e.g., a read command) along with address information (AWORD), such as such as a row address, column address, a bank address, a die identifier, or the like, that specifies a location for the memory access. The AWORD may also include command information, such as clock signals used for the timing of operations and command identifiers. The accessed information (DWORD), such as the write data or the read data can also be exchanged through the native uBumps 305.

In some embodiments, the interface die 304 may include a serializer 333 configured to process the DWORD between the core dies 306 to the native uBumps 305. For example, the serializer 333 may receive information in parallel along a first number of data lines (e.g., from the core 306), and then provide that information in a serial fashion along a second number of data lines (e.g., to the native uBumps 305). The serializer 333 may be used to multiples a number of outputs (e.g., from the core 306) to a smaller number of data lines (e.g., to the native uBumps 305).

In addition to the operational configurations (e.g., native operational mode) associated with the native uBumps 305, the memory device 300 can be configured to operate in a test mode (e.g., a BIST mode or other self-test modes). In test mode, the memory device 300 can determine one or more characteristics (e.g., signal responses, manufacturing defects, failure or error related aspects, or other aspects of the circuit) of the memory device 300. The memory device 300 may utilize the P1500 uBumps 320 and/or the DA uBumps 316 as the test interface. For example, the P1500 uBumps 320 may be used to communicate signals with the host device according to a predetermined sequence or protocol for sending and receiving signals.

The memory device 300 may use a BIST sequencer 328 (e.g., during a P1500 operational mode) to process the signals communicated through the P1500 uBumps 320. The P1500 uBumps 320 and the BIST sequencer 328 may be coupled to a test interface circuit (e.g., a P1500 circuit) 324 that is configured to interpret signals according to the P1500 protocol. For example, the P1500 circuit 324 may translate signals received at the P1500 uBumps into signals usable by other circuits of the memory device 300 and vice versa.

During a test mode (e.g., a BIST operational mode), instructions may be received to operate the BIST sequencer 328 to perform a test of the memory device 300. The BIST sequencer 328 may generate a test sequence (e.g., a string of logical bits) to write to memory cells of the core die 306. The BIST sequencer 328 may include a number of registers which may be used to store addresses of memory cells to test as well as a test sequence. In some embodiments, the test sequence and/or addresses may be generated within the BIST sequencer 328 based on instructions. For example, the BIST sequencer 328 may perform a test on a certain address value, increment that address value by one, and then perform the test again. In some embodiments, to save space in the BIST sequencer 328, the BIST sequencer 328 may load the test sequences into a look-up-table, such as data topology (DTOPO) circuit 330. Each entry in the DTOPO circuit 330 may be associated with a pointer value (e.g., an index value) and in a manner similar to the addresses the BIST sequencer 328 may generate a sequence of pointer values.

During a write portion of a test, the BIST sequencer 328 may provide address information (e.g., one or more row and column addresses) and a test sequence (e.g., data to be written to the memory cells specified by the address information) to an input buffer 334 (e.g., a register, such as a write FIFO (WFIFO)). In some embodiments, the BIST sequencer 328 may provide the address information to the input buffer 334, and may provide index information to the DTOPO circuit 330, which may provide the test sequence to the input buffer 334. Based on the address information provided from the WFIFO 334, the test sequence may be written to the memory cells specified by the address information.

During a read portion of a test, the BIST sequencer 328 may provide address information to retrieve a test sequence previous stored in the core die 306. Information may be read out from the memory cells specified by the address information to an output buffer 335 (e.g., a read FIFO (RFIFO)). The output buffer circuit 335 may generally be similar to the input buffer 334, except that the output buffer 335 may receive information from the core die 306 and then provides it on to other circuits of the interface die 304.

The interface die 304 may include an error catch memory (ECM) circuit 332 configured to generate error related results based on the read test sequence. The ECM circuit 332 may be coupled to the address information and test sequences provided to the input buffer 334, and include one or more registers used to store the written test sequences as well as address information. When a read operation is performed, the ECM circuit 332 may compare the read test sequence from the output buffer 335 to the test sequence which was written to those memory cells as part of an earlier write operation. The ECM circuit 332 may generate the results (e.g., indication of mismatches, failed memory cells, or the like) based on such comparison. The ECM circuit 332 may then provide the result information to the P1500 circuit 324, which may then provide the result information out of the memory over the P1500 uBumps.

In addition to or as an alternative to the P1500 uBump 320, the memory device 300 can provide access to the core dies 306 through the DA ubump 316 (e.g., the DA bumps 116 of FIG. 1E). The memory device 300 can be configured to provide direct accesses thereto, such as by bypassing other components of a SiP package (e.g., such as the processor 110) through the DA bump 316. These DA uBumps 316 may, in some embodiments, be organized into a probe pad, where an external device (e.g., probes, a tester) may be coupled to DA uBumps 316 in order to access the interface die 304 (and through it the core die 306). For example, the memory device 300 can communicate directly with an external tester through the DA uBumps 316 to implement a test. The signals may be communicated according to the P1500 interface protocol. Accordingly, the DA uBumps 316 may be used to implement the self-test described above for the P1500 uBump, such as by load information to/from test circuits (e.g., the DTOPO circuit 330 and/or the ECM circuit 332) through the DA uBumps 316. The test information may be communicated between the DA uBumps 316 and the P1500 circuit 324 and then communicated to/from the other circuits as described above.

As an illustrative example, the test sequences may be loaded into the DTOPO circuit 330 through the DA uBumps 316. Each test sequence may represent a string of logical bits which may be provided (serially or in parallel) to the core die. The test sequence may have a number of bits to match the amount of data in one or more DWORDs. In an example operation, when the DTOPO circuit is loaded, a tester may provide a string of bits to the DA uBumps 316, which may be routed to the P1500 circuit 324. The P1500 circuit may then provide the string of bits to the DTOPO circuit 330, where the bits may be stored.

The DA uBumps 316 can facilitate functions/communications similar to the native uBumps 305, such as for testing purposes. The DA uBumps 316 may be used to communicate AWORDs and DWORDs in a manner similar to the native uBumps 305. In some embodiments, there may be less DA uBumps 316 than there are native uBumps 305. In order to mimic the operation of signals along the native uBumps 305, the interface die 304 can include a deserializer circuit 322. The deserializer circuit 322 may receive the AWORD and DWORD from the DA uBumps 316 and then split the received serial data into a number of parallel channels. In some embodiments, the deserializer circuit 322 may split the AWORD and DWORD into a number of parallel channels that correspond to the circuit paths associated with the native uBumps 305. In some embodiments, the interface die 304 may include a DA converter 326 configured to route the communicated information to the core die 306 for testing purposes.

Even with the different connectors (e.g., the native uBumps 305, the DA uBumps 316, and/or the P1500 uBumps 320), system requirements may favor different connection configurations based on overall context. For example, in some embodiments, the SiP may require the multi-drop configuration 200a instead of the point-to-point configuration 200b or vice versa. Also, the same memory device 300 may be implemented or included in different system configurations, such as the example SiP devices 100a-100d of FIGS. 1A-1D.

Figure 4:
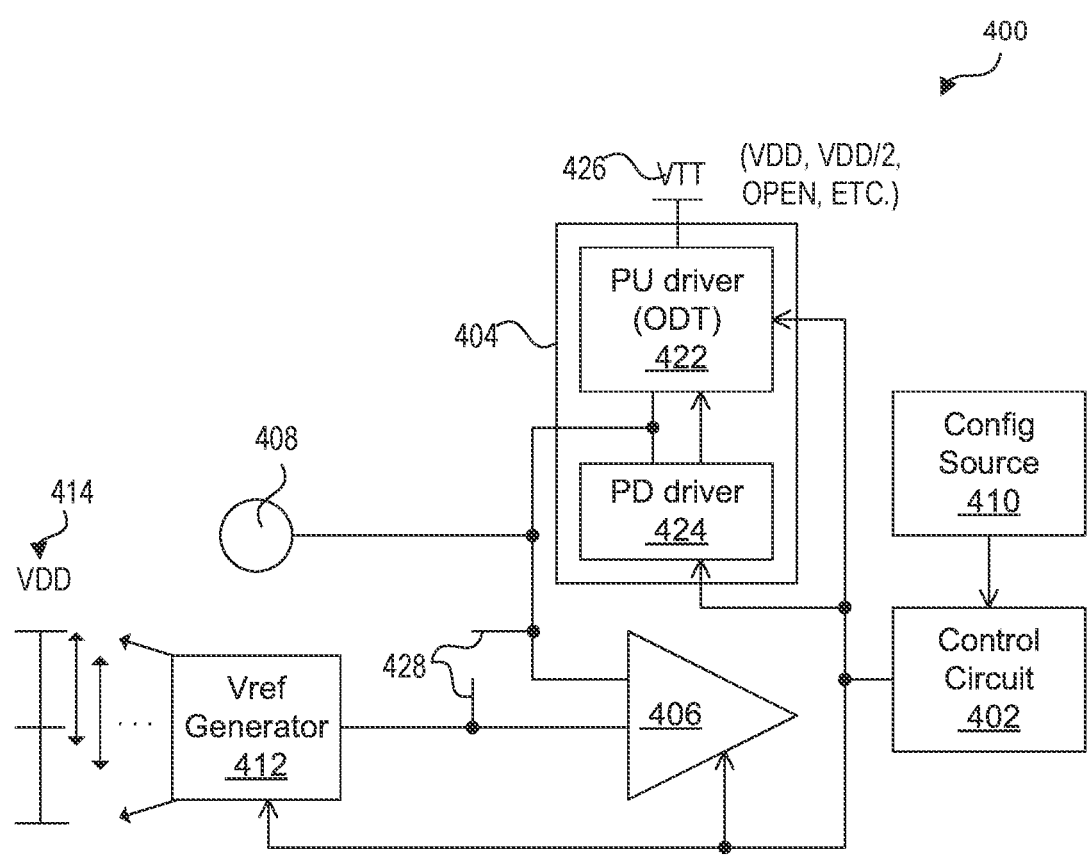
FIG. 4 is a block diagram of a reconfigurable interface circuit in accordance with embodiments of the technology.

To accommodate the different system configurations, the memory device 300 may include a reconfigurable interface circuit that selectively changes the communication mode of the memory device 300. For example, the reconfigurable interface circuit can selectively enable the memory device 300 to operate one or more signals paths as send and/or receive paths, supply terminated or non-terminated paths, single-ended or differential signal paths, multi-drop paths or point-to-point paths, or the like. As an illustrative example, FIG. 4 is a block diagram of a reconfigurable interface circuit 400 in accordance with embodiments of the technology. The memory device (e.g., the HBM 102 of FIGS. 1A-1E and/or the memory device 300 of FIG. 3) can include the reconfigurable interface circuit 400 that is configured to selectively change the communication mode of the memory device 300.

For illustrative purposes, the reconfigurable interface circuit 400 is described as facilitating communications and functions for memory tests over the DA uBumps 316 of FIG. 3. However, it is understood that the reconfigurable interface circuit 400 may be implemented for other paths, such as for the communication paths associated with the native uBumps 305 of FIG. 3, the P1500 uBumps 320 of FIG. 3, and/or other communication interfaces. Also, it is understood that the reconfigurable interface circuit 400 may be implemented in other types of devices and/or facilitate other types of signals, such as for normal operations (e.g., reads and/or writes), internal management operations (e.g., refresh, garbage collection, or other housekeeping operations), or the like.

In some embodiments, the memory device 300 can include the reconfigurable interface circuit 400 in the interface die (e.g., the interface die 104 of FIG. 1E or the interface die 304 of FIG. 3). The reconfigurable interface circuit 400 may be located closer to the corresponding interface (e.g., the DA uBumps 316) than the other/functional circuits (e.g., the core die 306). For example, the reconfigurable interface circuit 400 may be adjacent to the DA uBumps 316 of FIG. 3, the deserializer 322 of FIG. 3, the P1500 circuit 324 of FIG. 3, the BIST sequencer 328 of FIG. 3, or the like. Accordingly, the internal communications can remain constant for the functional operations, and the reconfigurable interface circuit 400 can adapt or translate the external interface according to the external/system requirements.

The reconfigurable interface circuit 400 may include a configuration control circuit 402, an output buffer 404, and an input buffer 406 coupled to an external connector 408 (e.g., one of the uBumps, such as one of the DA uBump 316). The output buffer 404 can be configured to communicate data to an external device (e.g., the tester) through the external connector 408. The input buffer 406 can be configured to communicate data from the external device through the external connector 408. In other words, the output buffer 404 can be used to send information (e.g., the data from the core die 306) out of the memory device, and the input buffer 406 can be used to receive information (e.g., the data from the tester) into the memory device.

The configuration control circuit 402 can include circuitry/logic configured to control the communication setting. For example, the configuration control circuit 402 can operate according to a predetermined setting stored in a configuration source 410 (e.g., one or more fuses, mode registers, or the like). The configuration control circuit 402 can operate the output buffer 404, the input buffer 406, and/or other circuits within the reconfigurable interface circuit 400, such as by activating certain circuits, controlling voltage sources, connecting/disconnecting circuit paths, or a combination thereof.

In some embodiments, the output buffer 404 can include a pull-up (PU) driver 422 and/or a pull-down (PD) driver 424 that may be operated or activated by the configuration control circuit 402. The PU driver 422 and/or the PD driver 424 may be configured to operate based on an output source 426 (VTT). The PU driver 422 may generate/drive the output data using a pull-up resister, such as by driving the signal high from a neutral-low state. The PU driver 422 may include an on-die termination circuit. The PD driver 424 may generate/drive the output data using a pull-down resister, such as by driving the signal low from a neutral-high state. The configuration control circuit 402 may select or activate one of the PU driver 422 and the PD driver 424 according to the configuration source 410. Also, the configuration control circuit 402 may control the output source 426 to provide different levels, such as a system voltage (VDD) 414, a reduced voltage (e.g., VDD/2), an open circuit, or other levels.

The configuration control circuit 402 may control a reference generator 412. The reference generator 412 may be configured to provide a variable reference level for receiving/processing signals. For example, the input buffer 406 can include one port (e.g., a high-level input) connected to the external connector 408 and one port (e.g., a low-level input) connected to the reference generator 412. The reference generator 412 can provide a reference level between electrical ground and the system voltage 414. In some embodiments, the reference generator 412 can provide a voltage level (e.g., negative voltage levels) below the electrical ground.

In some embodiments, the reconfigurable interface circuit 400 can include a coupling mechanism 428 configured to electrically couple a set of interface circuits. For example, the coupling mechanism 428 can electrically couple a set of (e.g., two) external connectors 408 to one of the buffers (e.g., the input buffer 406). Accordingly, the set of connectors can be used to communicate different portions of a single signal, such as for differential signaling. The coupling mechanism 428 may include a switch configured to electrically couple a corresponding set of external connectors (e.g., adjacent uBumps). Alternatively or additionally, the coupling mechanism 428 may include a switch matrix that may be configured to electrically connect a selectable set of the external connectors.

The configuration control circuit 402 can control the components in the reconfigurable interface circuit 400 to facilitate a selected communication setting. For example, the reconfigurable interface circuit 400 can activate the output buffer 404 and/or the input buffer 406, control the output source 426, control the reference level, and/or control the coupling mechanism 428 according to the predetermined setting (e.g., the system requirements). FIGS. 5A-5D are block diagrams of example configurations (e.g., settings for the reconfigurable interface circuit 400 of FIG. 4) in accordance with embodiments of the technology.

Figure 5A:
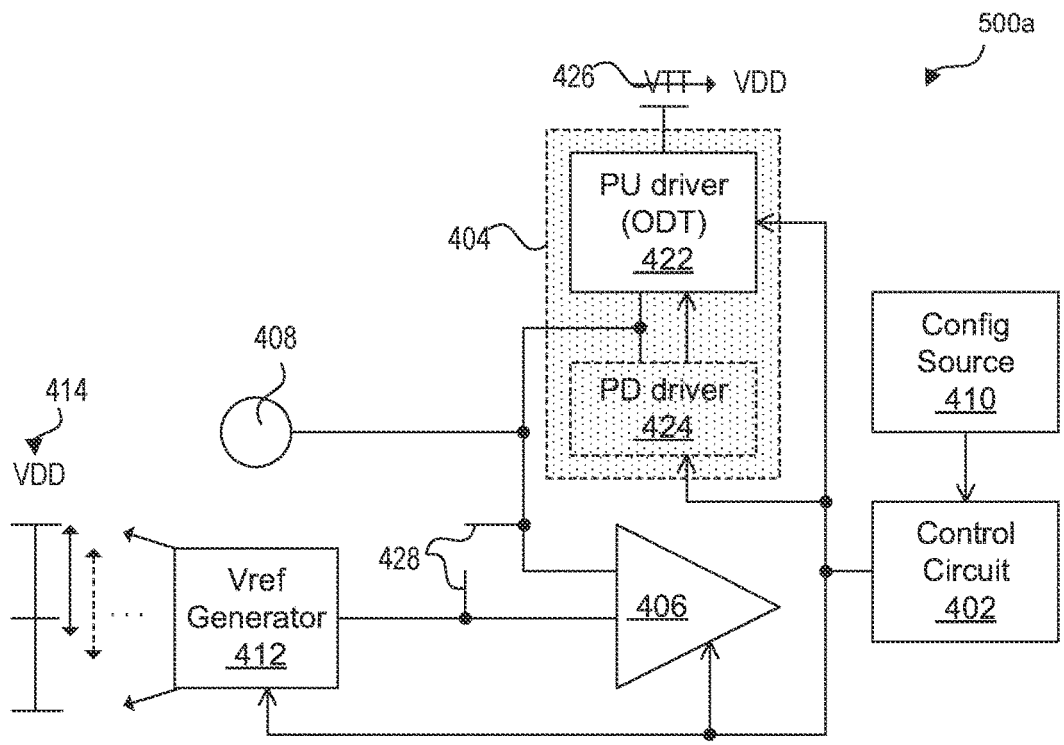
FIGS. 5A-5D are block diagrams of example configurations in accordance with embodiments of the technology.

FIG. 5A illustrates a first example setting 500a of the reconfigurable interface circuit 400 in accordance with an embodiment of the present technology. The first example setting 500A can facilitate an input-only communication, a single-ended signal, a signal termination (e.g., VDD termination, ODT, or the like), and/or the multi-drop configuration 200a of FIG. 2A. For the first example setting 500A, the configuration control circuit 402 can deactivate the output buffer 404, activate the input buffer 406, and/or control the reference generator 412 to provide a higher range reference. In some embodiments, the configuration control circuit 402 can deactivate the output buffer 404 based on activating the PU driver 422, deactivating the PD driver 424, and/or driving the output source 426 to the system voltage 414 (VDD).

Figure 5B:
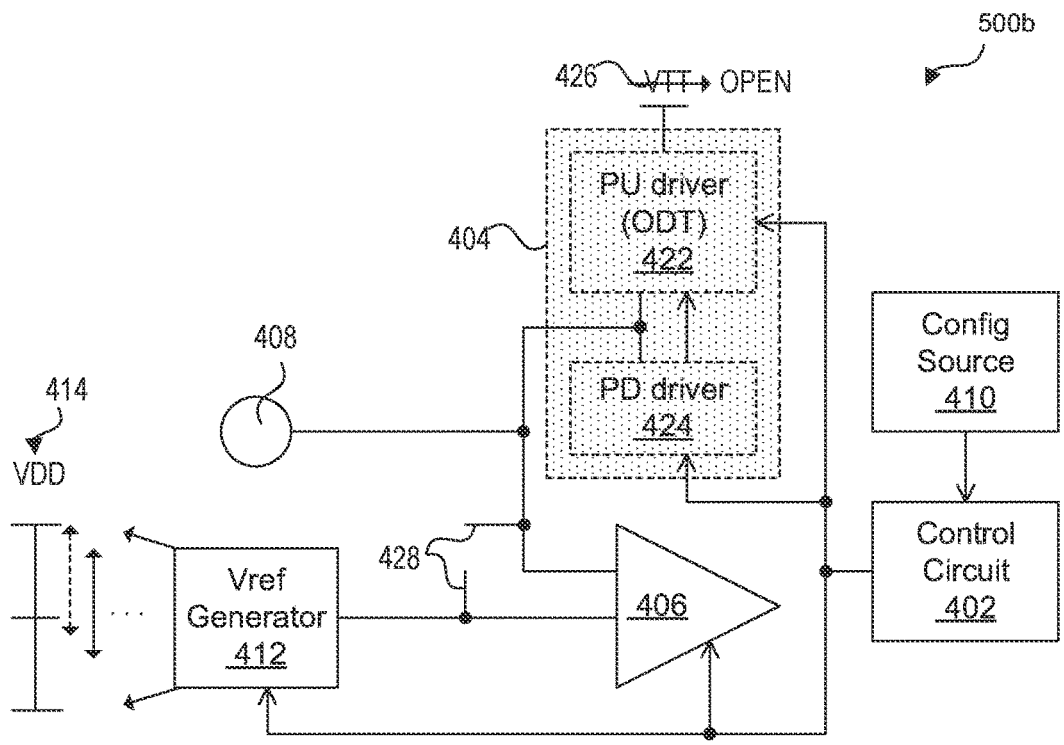

FIG. 5B illustrates a second example setting 500b of the reconfigurable interface circuit 400 in accordance with an embodiment of the present technology. The second example setting 500b can facilitate an input-only communication, a single-ended signal, no termination, and/or the point-to-point configuration 200b of FIG. 2B. For the second example setting 500b, the configuration control circuit 402 can deactivate the output buffer 404 (e.g., both the PU driver 422 and the PD driver 424), activate the input buffer 406, and/or control the reference generator 412 to provide a lower range reference. Along with deactivating the output buffer 404, the configuration control circuit 402 can further drive the output source 426 to open circuit.

Figure 5C:
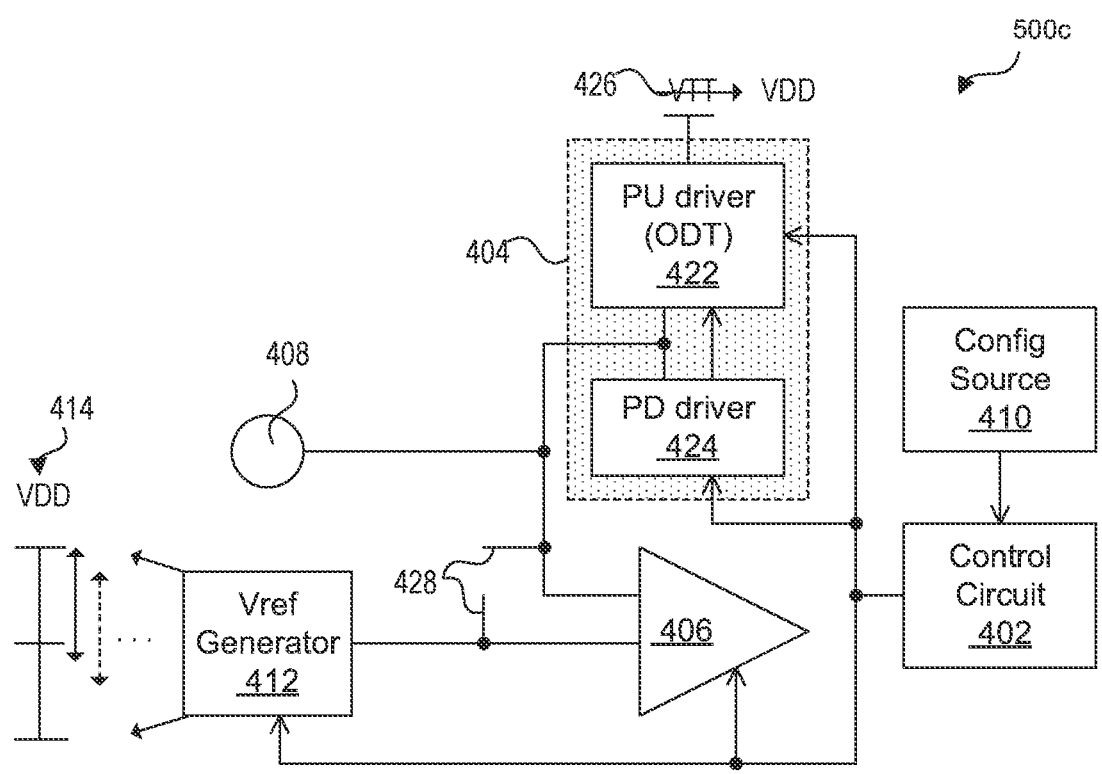

FIG. 5C illustrates a third example setting 500c of the reconfigurable interface circuit 400 in accordance with an embodiment of the present technology. The third example setting 500c can facilitate an input and/or an output communication, a single-ended signal, a signal termination, and/or the multi-drop configuration 200a of FIG. 2A. For the third example setting 500c, the configuration control circuit 402 can activate the output buffer 404 (e.g., both the PU driver 422 and the PD driver 424), activate the input buffer 406, and/or control the reference generator 412 to provide a higher range reference. Along with activating the output buffer 404, the configuration control circuit 402 can further drive the output source 426 to the system voltage 414.

Figure 5D:
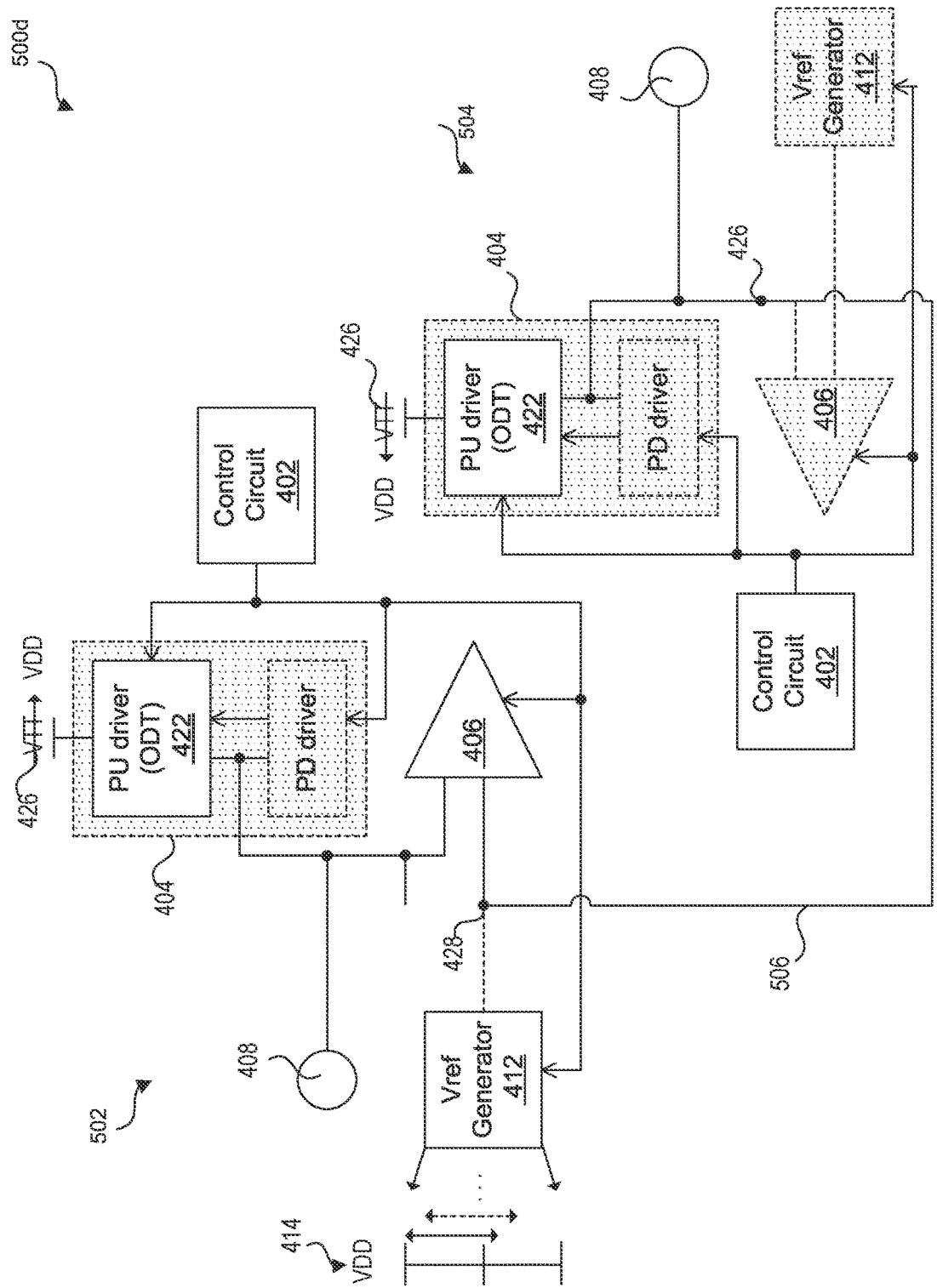

FIG. 5D illustrates a fourth example setting 500d of the reconfigurable interface circuit 400 in accordance with an embodiment of the present technology. The fourth example setting 500d can correspond to a differential signaling configuration. The fourth example setting 500d can correspond to a first interface circuit 502 (e.g., a first instance of the reconfigurable interface circuit 400 of FIG. 4) electrically coupled to a second interface circuit 504 (e.g., a second instance of the reconfigurable interface circuit 400). The configuration control circuit 402 can control the coupling mechanisms 428 of the first and second interface circuits 502 and 504 to form a cross-circuit connection 506. The cross-circuit connection 506 can connect a low port of an activated input buffer 406 (e.g., the input buffer of the first interface circuit 502) to the external connector 408 of the second interface circuit 504. The configuration control circuit 402 may disconnect and/or deactivate the reference generator 412 for the first interface circuit 502 and/or the second interface circuit 504. In other words, the configuration control circuit 402 can connect a second connector (e.g., another uBump) to the input buffer 406 to facilitate a differential signal connection.

The example illustrate in FIG. 5D may further correspond to facilitating an input-only communication, a signal termination, and/or the multi-drop configuration 200a of FIG. 2A. Accordingly, the configuration control circuit 402 can deactivate the output buffer 404, activate the input buffer 406, and/or deactivate the reference generator 412 for the first interface circuit 502 and/or the second interface circuit 504. In some embodiments, the configuration control circuit 402 can activate the PU driver 422 and deactivate the PD driver for the first interface circuit 502 and/or the second interface circuit 504. Moreover, the configuration control circuit 402 can further drive the output source 426 to the system voltage 414.

Figure 6B:
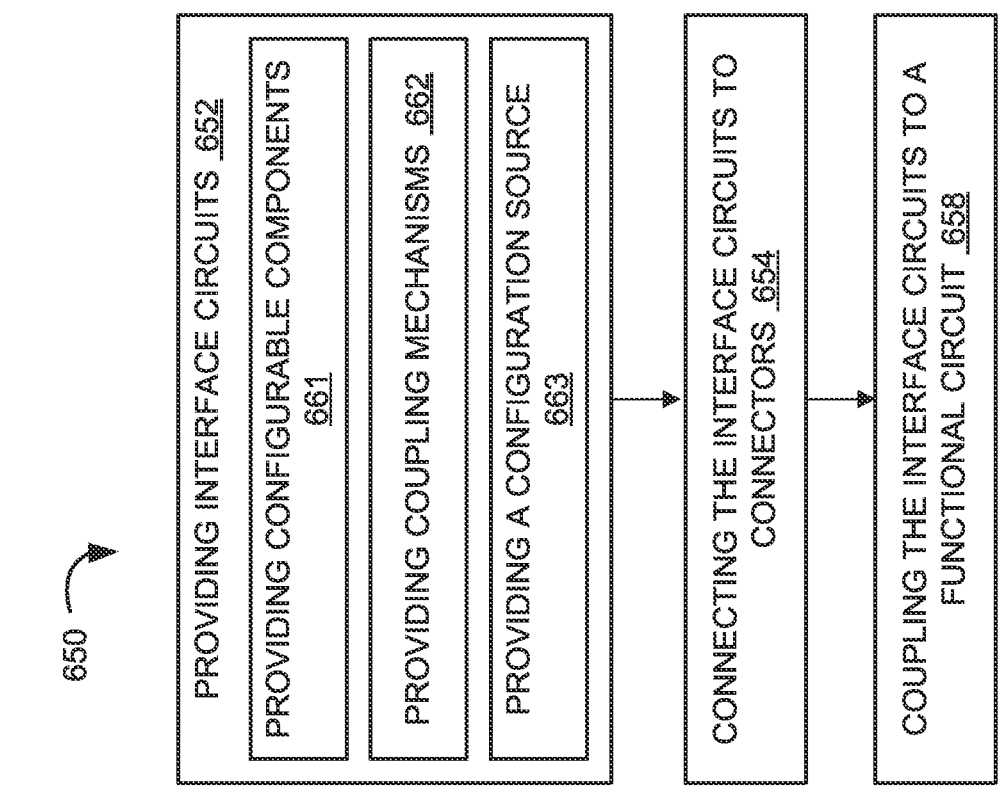
FIGS. 6A and 6B are flow diagrams illustrating example methods of manufacturing an apparatus in accordance with an embodiment of the present technology.
Figure 6A:
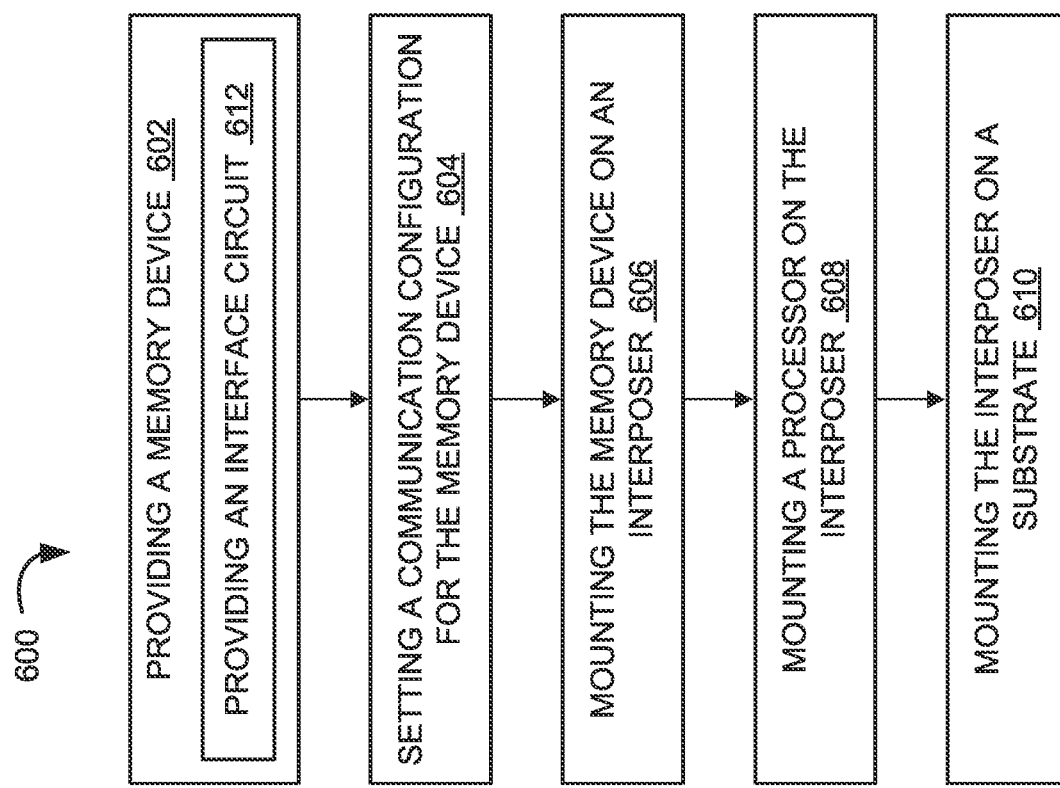

FIGS. 6A and 6B are flow diagrams illustrating example methods of manufacturing an apparatus in accordance with an embodiment of the present technology. FIG. 6A illustrates an example method 600 of manufacturing a device (e.g., the SiP device 100a, 100b, 100c, and/or 100d) in accordance with an embodiment of the present technology.

At block 602, the method 600 can include providing a memory device (e.g., one or more of the memory devices 102 of FIGS. 1A-1E and/or the memory device 300 of FIG. 3, such as the HBM device). The memory device can be placed on a platform and/or grasped for subsequent processing.

Providing the memory device may include providing an interface circuit (e.g., the interface die 104 of FIG. 1E, the interface die 304 of FIG. 3, and/or the reconfigurable interface circuit 400 of FIG. 4) as illustrated in block 612. For example, the provided memory device may include the interface circuit therein. Also, providing the memory device may include attaching, adjusting, configuring, or similarly processing the interface circuit and/or other related circuits.

In some embodiments, providing the memory device and/or the interface circuit may include manufacturing the memory device or a portion therein, such as using silicon-level manufacturing processes. An example of the memory device manufacturing process is described below.

At block 604, the method 600 can include setting a communication configuration for the memory device. In some embodiments, the configuration setting for the interface circuit may be set or written into the configuration source 410 of FIG. 4, such as through an initial configuration process. For example, specific setting values representative of a communication setting (e.g., a value representative of one of example settings 500a-500d of FIGS. 5A-5B or other similar settings) may be written into one or more fuses, other non-volatile memory, MRS settings, or the like. Also, setting the communication configuration may include attaching jumpers and/or adjusting pin or other external settings for the memory device, the interface circuit, or both. Alternatively or additionally, the initially set communication configuration may be a default setting that may be adjusted or overwritten during deployment/operation of the memory device, such through a value set in the MRS by the processor or an external system. The initially set communication configuration may be a default setting.

At block 606, the method 600 can include mounting the memory device on an interposer. For example, the method 600 can include mounting one or more of the memory devices 102 (e.g., HBMs) on the interposer 112. Mounting the memory device may include aligning the memory devices and/or the corresponding connectors (e.g., the uBumps) to connection pads (e.g., pads associated with the channels 105 of FIG. 1E and/or the direct access bumps 116 of FIG. 1E) on the interposer 112. Mounting the memory device may further include physically connecting the structures, such as by reflowing solder, diffusion bonding, physical and/or chemical adhesives, or the like.

At block 608, the method 600 can include mounting a processor (e.g., the processor 110 of FIGS. 1A-1E) on the interposer (e.g., the interposer 112). The processor mounting process may be similar to the memory mounting process. For example, the processor and/or bumps thereon may be aligned to corresponding locations on the interposer. Also, the processor may be physically attached to the interposer. In some embodiments, the processor and the memory device(s) may be mounted simultaneously.

At block 610, the method 600 can include mounting the interposer on a substrate (e.g., the package substrate 114 of FIG. 1E). The interposer mounting process may be similar to the device mounting process described above, such as by incorporating alignment and physical attachment processes. In some embodiments, the interposer mounting and device mounting processes may occur simultaneously. In other embodiments, the device mounting and the interpose mounting processes may occur separately, such as using different reflow temperature/duration, different attachment mechanism or setting, or the like.

FIG. 6B illustrates an example method 650 of manufacturing a memory device (e.g., one or more of the memory devices 102 of FIGS. 1A-1E and/or the memory device 300 of FIG. 3). At block 652, the method 650 can include providing interface circuits (e.g., a set of the reconfigurable interface circuits 400). Providing the interface circuits may include providing configurable components (e.g., the control circuit 402, the output buffer 404, etc. described above for the reconfigurable interface circuit 400) for each interface circuit as illustrated in block 662.

Providing the interface circuits may include also include providing coupling mechanisms (e.g., the coupling mechanism 428) for each interface circuit as illustrated in block 664. The coupling mechanism 428 may include connection paths, switches, multiplexers, switching matrix, buses, or the like configured to selectively connect/disconnect electrical connections, thereby selectively forming different electrical paths between different endpoints. In some embodiments, the coupling mechanism 428 can be formed to enable selective electrical connections between predetermined or adjacent interface circuits. In other embodiments, the coupling mechanism 428 can be formed (such as using buses and/or switching matrices) to enable selective electrical connections between a predetermined set of interface circuits or between all available interface circuits.

At block 656, the method 650 can include providing a configuration source (e.g., the configuration source 410) for one or more interface circuits. As examples, the provided configuration source may include a register, a latch, a non-volatile memory (e.g., a fuse, a Flash memory cell, or the like), an adjustable physical configuration (e.g., a dip switch, a setting pin, a jumper configuration/receiver, or the like), or a combination thereof.

Providing the circuits and components may include forming silicon-level circuits, such as by doping, depositing metal, masking, removing/planarizing, and/or other silicon-level manufacturing processes. Alternatively or additionally, providing the circuits and components may include mounting circuits onto a device substrate. The circuits may be electrically coupled through one or more traces, wires, connection layers, or the like.

At block 654, the method 650 can include connecting the interface circuits to connectors (e.g., uBumps of FIG. 2). For example, a set of pads may be formed on a surface of the substrate (e.g., silicon substrate or the device substrate) based on masking, metallization, and/or other silicon-level manufacturing processes. Solder bumps or other metal connectors may be formed on the pads for electrically connecting the interface circuit to external devices (e.g., the interposer 112).

Blocks 652 and 654 and/or blocks 661-663 may correspond to one or more processes or aspects for manufacturing an interface die (e.g., the interface die 104 of FIG. 1E and/or the interface die 304 of FIG. 3). In some alternative embodiments, the interface die may include wire leads instead of pads and bumps/connectors as described above.

At block 658, the method 650 can include coupling the interface circuits to a functional circuit (e.g., one or more memory core dies 106 of FIG. 1E and/or and one or more core dies 306 of FIG. 3). In some embodiments, the core dies may be mounted over the interface die and electrically coupled to each other, such as to form a die stack. In other embodiments, the core dies and the interface die may be arranged differently (e.g., with one or more dies side-by-side or embedded in another structure) while remaining electrically coupled to each other. The device resulting from coupling the interface circuits to the functional circuit(s) may include the memory device 102 (e.g., the HBM).

Figure 7:
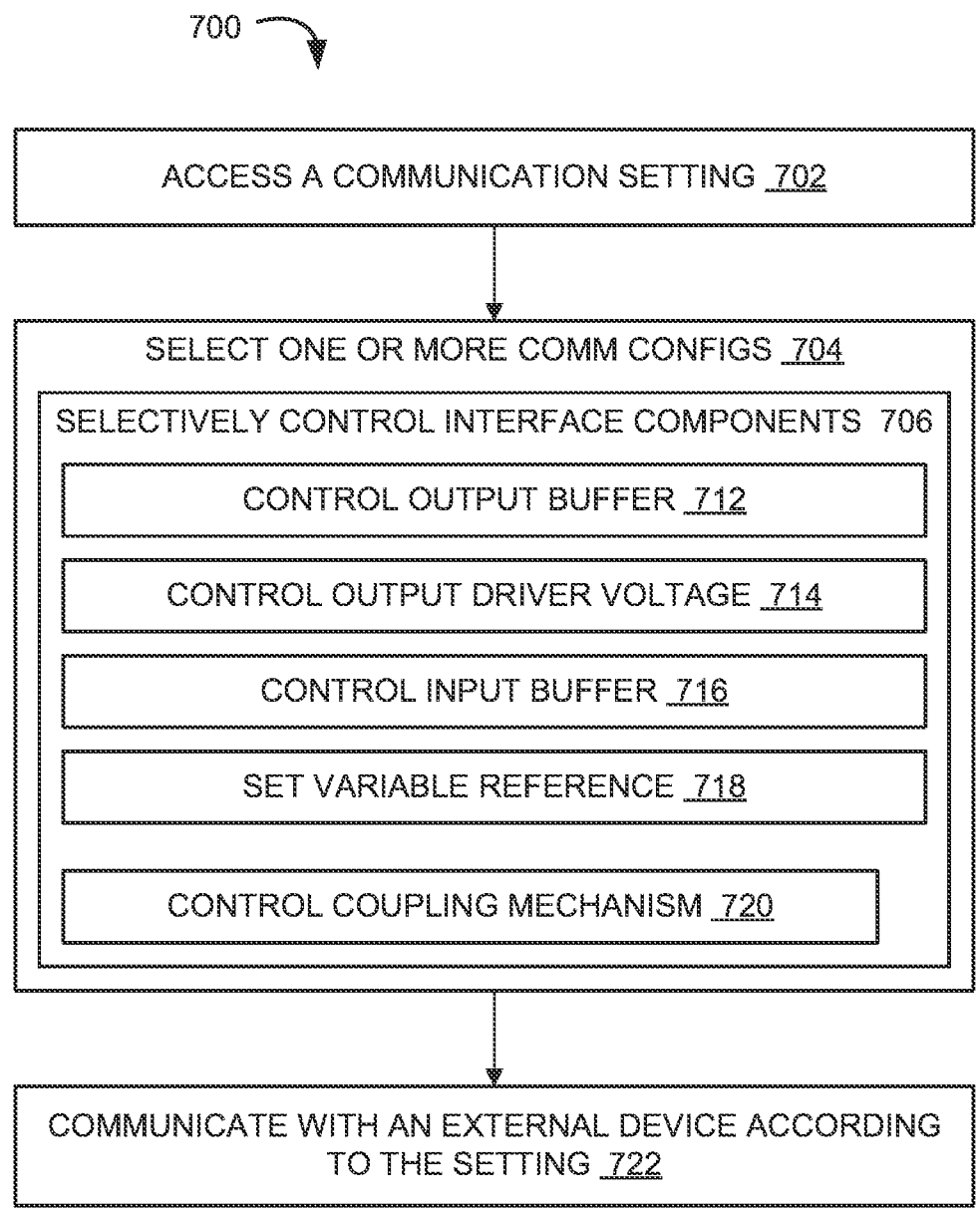
FIG. 7 is a flow diagram illustrating an example method of operating an apparatus in accordance with an embodiment of the present technology.

FIG. 7 is a flow diagram illustrating an example method 700 of operating an apparatus (e.g., the SiP device, the memory device, or a portion thereof, such as the reconfigurable interface circuit 400 of FIG. 4) in accordance with an embodiment of the present technology. At block 702, the apparatus can access a communication setting. For example, the control circuit 402 of FIG. 4 can access the configuration source 410 of FIG. 4 for the setting information stored therein.

At block 704, the apparatus can select one or more communication configurations. For example, the apparatus can select: (1) a multi-drop communication configuration or a point-to-point communication configuration, (2) an input communication path and/or an output communication path, (3) a terminated path or a non-terminated path, (4) a single-ended communication configuration or a complementary communication configuration, or a combination thereof for the exchanged/communicated signals.

As illustrated in block 706, the selected configuration can correspond to or can be implemented by selectively control interface components according to the accessed communication setting. For example, the control circuit 402 can set, adjust, activate/deactivate, connect/disconnect, or similarly operate one or more reconfigurable components within the reconfigurable interface circuit 400 according to the accessed communication setting.

Selectively controlling the interface components may include controlling output buffer(s) (e.g., the output buffer 404 of FIG. 4) as illustrated in block 712. For example, the control circuit 402 may activate/deactivate the PU driver 422 of FIG. 4 and/or the PD driver 424 of FIG. 4 according to the communication setting. As illustrated in block 714, the control circuit 402 can also control output driver voltage (e.g., the output source 426 of FIG. 4) utilized by the output buffer(s). For example, the control circuit 402 can set the output source 426 to the system voltage 414 (e.g., VDD or full/high level), an intermediate voltage less than the system voltage 414, or an open circuit setting.

Selectively controlling the interface components may further include controlling input buffer(s) (e.g., the input buffer 406 of FIG. 4) as illustrated in block 712 and/or the variable reference (e.g., the reference generator 412 of FIG. 4) as illustrated in block 712. For example, the control circuit 402 may activate/deactivate the input buffer 406 and/or activate/deactivate the reference generator 412 according to the communication setting. Also, the control circuit 402 can adjust the reference level/output from the reference generator 412 to enable receiving a full/high range of signal magnitudes (e.g., up to the system voltage 414) or a reduced range thereof.

At block 720, the apparatus can control coupling mechanism(s) (e.g., the coupling mechanism 428 of FIG. 4) in selectively controlling the interface components. For example, the control circuit 402 can implement single-ended path or complementary paths (e.g., differential signal paths) based on controlling the coupling mechanisms. The control circuit 402 can implement the single-ended path based on operating the coupling mechanisms 428 to connect each input buffer 406 to a corresponding connector 408 of FIG. 4 and a corresponding reference generator 412 as described above. The control circuit 402 can implement the complementary paths by coupling one input buffer to a set (e.g., two) connectors and disconnecting/deactivating/adjusting other components as necessary to enable the one input buffer to receive and process the signals communicated through the set of connectors. An example of the complementary path setting is described above for the example setting 500d of FIG. 5D.

At block 722, the apparatus can communicate with an external device according to the setting. For example, the memory device can communicate with the processor and/or an external device (e.g., a tester, such as through the P1500 connections and/or the DA connections) according to the implemented communication setting. Thus, the reconfigurable interface circuit 400 can enable one device (e.g., the memory device 102) to meet any one of multiple communication/system requirements as described above. Accordingly, the reconfigurable interface circuit 400 can provide increased applicability for the memory device 102 and provide the reduction in design/engineering resources to otherwise adapt the device to each unique set of requirements.

Figure 8:
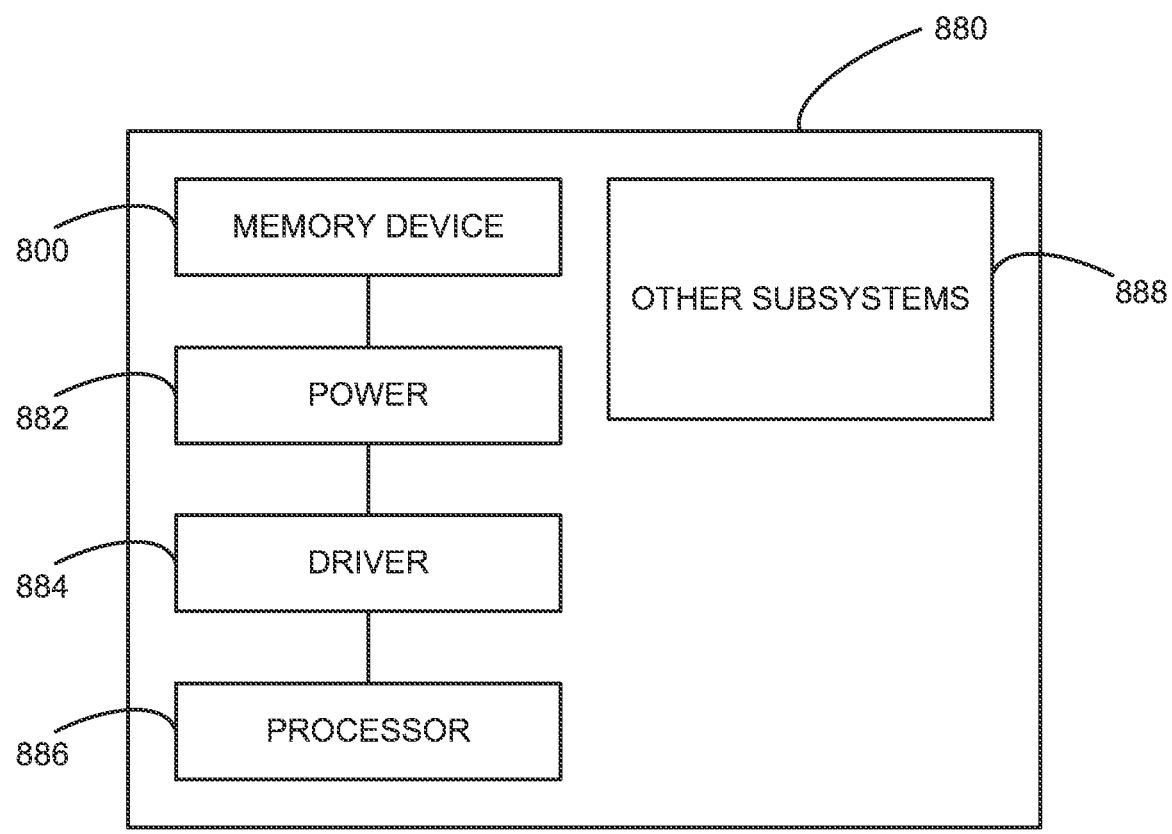
FIG. 8 is a schematic view of a system that includes an apparatus configured in accordance with embodiments of the present technology.

FIG. 8 is a schematic view of a system that includes an apparatus in accordance with embodiments of the present technology. Any one of the semiconductor devices described above with reference to FIGS. 1A-7 can be incorporated into any of a myriad of larger and/or more complex systems, a representative example of which is system 880 shown schematically in FIG. 8. The system 880 can include a semiconductor device 800 ("device 800") (e.g., a semiconductor device, package, and/or assembly), a power source 882, a driver 884, a processor 886, and/or other subsystems or components 888. The device 800 can include features generally similar to those devices described above. The resulting system 880 can perform any of a wide variety of functions, such as memory storage, data processing, and/or other suitable functions. Accordingly, representative systems 880 can include, without limitation, hand-held devices (e.g., mobile phones, tablets, digital readers, and digital audio players), computers, and appliances. Components of the system 880 may be housed in a single unit or distributed over multiple, interconnected units (e.g., through a communications network). The components of the system 880 can also include remote devices and any of a wide variety of computer-readable media.

This disclosure is not intended to be exhaustive or to limit the present technology to the precise forms disclosed herein. Although specific embodiments are disclosed herein for illustrative purposes, various equivalent modifications are possible without deviating from the present technology, as those of ordinary skill in the relevant art will recognize. In some cases, well-known structures and functions have not been shown or described in detail to avoid unnecessarily obscuring the description of the embodiments of the present technology. Although steps of methods may be presented herein in a particular order, alternative embodiments may perform the steps in a different order. Similarly, certain aspects of the present technology disclosed in the context of particular embodiments can be combined or eliminated in other embodiments. Furthermore, while advantages associated with certain embodiments of the present technology may have been disclosed in the context of those embodiments, other embodiments can also exhibit such advantages, and not all embodiments need necessarily exhibit such advantages or other advantages disclosed herein to fall within the scope of the technology. Accordingly, the disclosure and associated technology can encompass other embodiments not expressly shown or described herein, and the invention is not limited except as by the appended claims.

Throughout this disclosure, the singular terms "a," "an," and "the" include plural referents unless the context clearly indicates otherwise. Similarly, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the terms "comprising," "including," and "having" are used throughout to mean including at least the recited feature(s) such that any greater number of the same feature and/or additional types of other features are not precluded. Reference herein to "one embodiment," "an embodiment," "some embodiments" or similar formulations means that a particular feature, structure, operation, or characteristic described in connection with the embodiment can be included in at least one embodiment of the present technology. Thus, the appearances of such phrases or formulations herein are not necessarily all referring to the same embodiment. Furthermore, various particular features, structures, operations, or characteristics may be combined in any suitable manner in one or more embodiments.

What is claimed is:

1. A memory device, comprising:
   a connector configured to communicate signals with an external circuit;
   a variable output source configured to provide a variable driver voltage;
   an output buffer coupled to the connector and the variable output source, the output buffer configured to generate output signals based on the variable driver voltage, wherein the output signals are sent to the external circuit through the connector;
   a variable reference generator configured to provide a variable signal reference;
   an input buffer coupled to the connector and the variable reference generator, the input buffer configured to receive input signals from the external circuit through the connector, wherein the input signals are received based on the variable signal reference; and
   a control circuit configured to control the variable output source, the output buffer, the variable reference generator, the input buffer, or a combination thereof to selectively configuring a communication setting for signals exchanged through the connector.

2. The memory device of claim 1, wherein the control circuit is configured to control the variable output source, the output buffer, the variable reference generator, the input buffer, or a combination thereof to implement (1) a multi-drop communication configuration or a point-to-point communication configuration, (2) an input communication path and/or an output communication path through the connector, (3) a terminated path or a non-terminated path through the connector, (4) a single-ended communication configuration or a complementary communication configuration, or a combination thereof.

3. The memory device of claim 2, wherein the control circuit is configured to selectively configure the communication setting to implement (1) the multi-drop communication configuration, (2) the input communication path without the output communication path, (3) the terminated path, and (4) the single-ended communication configuration.

4. The memory device of claim 3, wherein the control circuit is configured to selectively configure the communication setting based on (a) activating a terminated circuit in the output buffer, (b) activating the input buffer, (c) controlling the variable output source to provide a system voltage, and (d) controlling the variable reference generator to receive up to the system voltage.

5. The memory device of claim 2, wherein the control circuit is configured to selectively configure the communication setting to implement (1) the point-to-point communication configuration, (2) the input communication path without the output communication path, (3) the non-terminated path, and (4) the single-ended communication configuration.

6. The memory device of claim 5, wherein the control circuit is configured to selectively configure the communication setting based on (a) deactivating the output buffer, (b) activating the input buffer, (c) controlling the variable output source to provide an open setting, and (d) controlling the variable reference generator to receive up to a reduced voltage less than a system voltage.

7. The memory device of claim 2, wherein the control circuit is configured to selectively configure the communication setting to implement (1) the multi-drop communication configuration, (2) both input and output communication paths through the connector, (3) the terminated path, and (4) the single-ended communication configuration.

8. The memory device of claim 7, wherein the control circuit is configured to selectively configure the communication setting based on (a) activating both a pull-up driver and a pull-down driver in the output buffer, (b) activating the input buffer, (c) controlling the variable output source to provide a system voltage, and (d) controlling the variable reference generator to receive up to the system voltage.

9. The memory device of claim 2, wherein:
the connector comprises a first connector configured to communicate first signals with the external circuit;
the input buffer includes a signal port and a reference port, the input buffer configured to receive the input signals based on comparing voltages at the signal port and the reference port;
further comprising:
a second connector communicate second signals with the external circuit; and
a coupling mechanism connected between (1) the first connector and the signal port of the input buffer and (2) the variable reference generator and the reference port of the input buffer, the coupling mechanism selectively operable to couple the input buffer to the second connector for implementing the complementary communication configuration, wherein the first and second signals are complementary signals that correspond to a single stream of information.

10. The memory device of claim 9, wherein:
the control circuit is configured to operate the coupling mechanism to couple the reference port of the input buffer to the second connector instead of the variable reference generator; and
the first output source, the first output buffer, the first reference generator, the first input buffer, the first coupling mechanism, and the first control circuit comprise a first reconfigurable interface circuit for the first connector;
further comprising:
a second reconfigurable interface circuit including a second output source, a second output buffer, a second reference generator, a second input buffer, a second coupling mechanism, and a second control circuit, the second reconfigurable interface circuit configured to selectively configuring a communication setting for signals exchanged through the second connector, wherein the second control circuit is configured to operate the second coupling mechanism connect the second connector to the first input buffer instead of the second input buffer for the complementary communication configuration.

11. The memory device of claim 10, wherein the first and second control circuits are configured to configure the communication setting to implement (1) the multi-drop communication configuration, (2) the input communication paths without the output communication paths, (3) the terminated paths for the first and second connectors along with the complementary communication configuration.

12. The memory device of claim 1, wherein the variable output source configured to provide a variable driver voltage is configured to selectively provide at least a system voltage, a reduced voltage less than the system voltage, and an open circuit setting.

13. The memory device of claim 1, wherein:
the output buffer includes
a pull-up driver configured to selectively generate the output signals;
a pull-down driver configured to selectively generate the output signals; and
the control circuit is configured to activate the pull-up driver, the pull-down driver, or both according to the selected communication setting.

14. The memory device of claim 13, wherein the pull-up driver includes an on-die termination circuit.

15. The memory device of claim 1, further comprising:
a configuration source configured to store a setting representative of the communication setting; and
wherein:
the control circuit comprises a logic configured to access the setting and control according to the accessed setting the variable output source, the output buffer, the variable reference generator, the input buffer, or a combination thereof.

16. The memory device of claim 1, wherein the memory device comprises a high-speed memory (HBM) device.

17. The memory device of claim 16, wherein the HBM comprises a system-in-package (SiP) device that further includes a processor coupled to the HBM.

18. The memory device of claim 17, wherein the connector is a direct access connector configured to facilitate exchange of information directly between the external device and the HBM without communicating through the processor.

19. A method of operating a semiconductor device, the method comprising:
  accessing a setting representative of a communication setting for the semiconductor device; and
  according to the accessed setting, selectively controlling one or more components of the semiconductor device to select (1) a multi-drop communication configuration or a point-to-point communication configuration, (2) an input communication path and/or an output communication path, (3) a terminated path or a non-terminated path, (4) a single-ended communication configuration or a complementary communication configuration, or a combination thereof for communicated signals,
  wherein selectively controlling the one or more components includes:
    controlling an operating state of an output buffer configured to generate output signals based on a variable driver voltage that is set to one of at least two voltages; and
    controlling an operating state of an input buffer configured to receive input signals within a reading range up to a predetermined voltage from an external circuit according to a variable reference.

20. A method of operating a semiconductor device, the method comprising:
  accessing a setting representative of a communication setting for the semiconductor device; and
  according to the accessed setting, selectively controlling one or more components of the semiconductor device to select (1) a multi-drop communication configuration or a point-to-point communication configuration, (2) an input communication path and/or an output communication path, (3) a terminated path or a non-terminated path, (4) a single-ended communication configuration or a complementary communication configuration, or a combination thereof for communicated signals,
  wherein selectively controlling the one or more components includes:
    controlling an operating state of an output buffer configured to generate output signals based on a variable driver voltage, wherein controlling the operating state includes activating or deactivating a pull-up driver and a pull-down driver;
    setting the variable driver voltage to a system voltage, an intermediate voltage less than the system voltage, or an open circuit setting for generating the output signals;
    controlling an operating state of an input buffer configured to receive input signals from an external circuit according to a variable reference; and
    setting the variable reference to provide a reading range up to the system voltage or up to a reduced voltage for receiving the input signals.

21. The method of claim 20, wherein:
  the input buffer is connected to a first connector configured to receive a first signal;
  selectively controlling the one or more components includes disconnecting the input buffer from the variable reference; and
  connecting the input buffer to a second connector instead of the variable reference, wherein the second connector is configured to receive a second signal that is complementary to the first signal for communicating a single stream of information.

* * * * *